United States Patent [19]
Chang et al.

[11] Patent Number: 5,187,386
[45] Date of Patent: Feb. 16, 1993

[54] LOW STANDBY CURRENT INTERMEDIATE DC VOLTAGE GENERATOR

[75] Inventors: Shuen-Chin Chang, San Jose, Calif.; Moon G. Kim, Kyung Ki-Do, Rep. of Korea

[73] Assignee: Samsung Semiconductor, Inc., San Jose, Calif.

[21] Appl. No.: 641,883

[22] Filed: Jan. 16, 1991

[51] Int. Cl.[5] .................................... H03K 19/003
[52] U.S. Cl. ............................ 307/296.8; 307/296.1; 307/585
[58] Field of Search .............. 307/296.8, 296.6, 296.1, 307/585, 264

[56] References Cited

U.S. PATENT DOCUMENTS

| | | | |
|---|---|---|---|
| 4,663,584 | 5/1987 | Okada et al. | 307/296.8 |
| 4,812,735 | 3/1989 | Sawada et al. | 307/296.8 |
| 4,908,528 | 3/1990 | Huang | 307/524 |
| 5,027,053 | 6/1991 | Ohri et al. | 307/296.8 |

Primary Examiner—Paul M. Dzierzynski
Assistant Examiner—Tan Dinh
Attorney, Agent, or Firm—Hecker & Harriman

[57] ABSTRACT

An intermediate Dc voltage generator providing low standby current. The present invention is a CMOS-based integrated circuit that generates a reference voltage level. The present invention accomplishes this task while also minimizing power consumption allowing application for portable computers or other battery-operated devices. The present invention replaces the second stage transistors of the prior art with transistors that have channel lengths greater than the channel lengths of the first stage transistors. This increases the turn on voltage of the second stage transistors. In addition, the channel width of the second stage transistors is less than the channel width of the first stage transistors further increasing turn on voltage. In this way, the second stage transistors are off, reducing the switching current and standby current contributed by the driver transistors at second stage, and providing intermediate level voltage references. The configuration of this invention also reduces the current drawn by the second stage of transistors by providing enough margin of threshold voltage differences at first stage and second stage transistors to keep them normally off during operation of the circuit.

16 Claims, 3 Drawing Sheets

LOW STANDBY CURRENT INTERMEDIATE DC VOLTAGE GENERATOR

BACKGROUND OF THE INVENTION

1. Field of the Invention

This invention relates to the field of DC voltage generators and in particular to a DC voltage generator for generating low-standby current intermediate DC voltage levels for use in integrated circuits.

2. Background Art

Certain integrated circuit applications require low power operation. For example, CMOS-based (complementary metal oxide semiconductor) integrated circuits are typically low-power circuits. In addition, it is often desired to minimize power consumption such as in portable computers or battery-operated devices.

The operation of integrated circuits often requires that a signal be compared to a reference level such as a reference voltage. An on-chip DC voltage generator is often used to bias the capacitor plate of the DRAM memory array to ensure the optimum and reliable operation of memory cells. These reference voltages are typically generated by a DC voltage generator. An example of a DC voltage generator is illustrated in FIG. 1.

The prior art voltage generator of FIG. 1 consists of two complementary pairs of source coupled transistors. The first pair receives drain and gate current from a pair of biasing circuit to convert a supply voltage to some desired reference voltage. The second complementary pair of transistors are gate coupled to the drains of the first pair of transistors. This second pair of transistors functions as driver transistors and provide an output at their source coupled junction.

Referring to FIG. 1, the DC generator consists of a first complementary pair of transistors N1 and P1, a second pair complementary transistors N2 and P2 and bias circuits 11 and 15. VCC supply voltage 10 is provided to bias circuit 11. Bias circuit 11 provides an output at node 12 which is the drain of transistor N1. Node 12 is also coupled to the gate of transistor N1. The source of transistor N1 is coupled to the source of transistor P1 at node 13. Node 13 is also coupled to the body of transistor P1. The gate of transistor P1 is coupled to the drain of transistor P1 at node 14. Node 14 is coupled to bias circuit 15. Bias circuit 15 is also coupled to ground. Bias circuit 11 and bias circuit 15 can be any suitable bias circuit for providing a bias current at nodes 12 and 14 respectively. The voltage at node 13, $V_{REF}$, is the desired reference voltage of the circuit.

VCC supply voltage 10 is also coupled to the drain of transistor N2. The gate of transistor N2 is coupled to node 12 and the source of transistor N2 is coupled to node 16. Node 16 is coupled to the source of transistor P2. The drain of transistor P2 is coupled to ground and the gate of transistor P2 is coupled to node 14. Transistors N2 and P2 are drive transistors and provide an output voltage $V_{OUT}$ at node 16. $V_{OUT}$ is approximately equal to $V_{REF}$.

The voltage at node 12 is given by $V_{REF}+V_{TN1}$. The voltage at node 14 is given by $V_{REF}-|V_{Tp1}|$ (the turn-on voltage of transistor P1). These voltages are provided to the gates of transistors N2 and P2 respectively. The gate source voltage of transistors N2 and P2 are given by the following:

$$V_{GS(N2)} = (V_{REF} + V_{TN1}) - V_{OUT}$$

$$V_{GS(P2)} = (V_{REF} - |V_{Tp1}|) - V_{OUT}$$

Therefore, the output voltage $V_{OUT}$ at node 16 will be clamped in between $V_{OUTN}$ and $V_{OUTP}$, which are given by the following:

$$V_{OUTN} = V_{REF} + V_{TN1} - V_{TN2} = V_{REF} - (V_{TN2} - V_{TN1})$$

$$V_{OUTP} = V_{REF} - |V_{TP1}| + |V_{TP2}| = V_{REF} + (|V_{TP2}| - |V_{TP1}|),$$

where $V_{TN2}$ and $V_{TP2}$ are the turn on voltages of transistors N2 and P2.

A disadvantage of prior art voltage generators is an inability to provide intermediate reference voltages that have stable low-standby current capability with wide process margins. This is due in part to the relationship between the transistors N1, N2, P1 and P2. The turn on voltage, VTN2, of transistor N2 is typically less than or equal to the turn on voltage VTN1 of transistor N1. The turn-on voltage, $V_{TP2}$ of transistor P2 is typically less than or equal to the turn-on voltage $V_{TP1}$ of transistor P1. Therefore, both driver transistors N2 and P2 could be on at the same time, as illustrated in FIG. 5, and draw hundreds on micro-amperes of current while operating in standby modes. Referring to FIG. 5, a plot of output voltage versus supply voltage is illustrated. In the operating range of the circuit, there is a region 50 in which both N2 and P2 are on, drawing current. This is not effective for low standby current operations.

The relationship of the turn on voltages of transistors N1 and N2 is affected by channel length and channel width. Transistor N1 has an associated width WN1 and channel length LN1. Transistor P1 has a width WP1 and a length LP1. Transistor N2 has a width WN2 and a length LN2, and transistor P2 has a width WP2 and a length LP2.

The channel length of transistors N1 and N2 are approximately equal. That is, LN1 is approximately equal to LN2. In addition, the channel length of transistors P1 and P2 are approximately equal so that LP1 is approximately equal to LP2.

For transistors with fixed transistor widths, the threshold voltages decrease with decreasing channel length. This is known as the "short channel effect" and is illustrated in FIG. 3. FIG. 3 is a plot of the absolute value of threshold voltage VT (in volts) versus transistor channel length (in microns). For a transistor having a transistor width of 6–10 microns and channel length of approximately 0.6 microns, the threshold voltage has a value of approximately 0.6 volts. Threshold voltage is approximately 0.7 volts for a transistor having a channel length of approximately 1 micron. The threshold voltage increases with channel length and levels off at approximately 3.0 microns. The level-off point in FIG. 3 is dependent on the process technology used.

Threshold voltage $V_T$ is also dependent on transistor width. For transistors with fixed channel lengths, the threshold voltages increase with decreasing transistor width. The effect of transistor width on threshold voltage is known as "narrow width effect" and is illustrated in FIG. 4. Threshold voltage is inversely proportional to transistor width at four low transistor widths. For example, the threshold voltage of a transistor having a channel length of 1.2 microns and a width of approximately 2 microns is approximately 1.3 volts. The threshold voltage of a transistor having the width of approximately 4 microns is approximately 0.95 volts. The threshold voltage decreases with increasing transistor width and levels off at greater transistor widths, on the order of 8-10 microns. The level-off point in FIG. 4 is dependent on the process technology used.

SUMMARY OF THE PRESENT INVENTION

An intermediate DC voltage generator providing low standby current is described. The present invention is a CMOS-based integrated circuit that generates a reference voltage level. The present invention accomplishes this task while also minimizing power consumption allowing application for portable computers or other battery-operated devices.

The present invention replaces the second stage transistors of the prior art with transistors that have channel lengths greater than the channel lengths of the first stage transistors. This increases the turn on voltage of the second stage transistors. In addition, the channel width of the second stage transistors is less than the channel width of the first stage transistors further increase turn on voltage. In this way, as illustrated in FIG. 6, the configuration of this invention also reduces the switching and standby current drawn by the second stage of transistors, since either N2 or P2 is normally off during operation of the circuit. In the region 60, both P2 and N2 are off during operation of the circuit. During standby mode, the bias circuit is the only circuit that draws current. The bias current of this invention is designed in the range of 5-10 micro-amperes.

The present invention comprises a first pair of complementary MOS transistors having a bias circuit coupled to the source of each transistor. The source of the PMOS transistor of said first pair is also coupled to the gate of a multiple of PMOS transistors which are coupled together in parallel. The source of the NMOS transistor of said first pair is also coupled to the gates of a multiple of NMOS transistors which are coupled together in parallel. The coupled drains of both sets of multiple transistors are coupled together and this is where the output voltage is taken.

The present invention improves prior art DC generators by replacing a second pair of CMOS transistors with a plurality of CMOS-based parallel transistors coupled together, thereby taking advantage of the narrow width effect. For proper operation of the low power DC voltage generator, the NMOS and PMOS transistors of the second pair must not be turned on at the same time and thus the threshold voltage for the NMOS and PMOS transistors of the second pair of CMOS transistors must be greater than the threshold voltage of the NMOS and PMOS transistors of the first pair. By splitting up the original NMOS and PMOS transistors into a plurality of NMOS and PMOS transistors in parallel, the subsequent NMOS and PMOS transistors have narrower widths which directly increases the threshold voltage.

The present invention also utilizes the short channel effect by ensuring that the length of the channels of the second pair are greater than the length of the channel from the NMOS and PMOS transistor of the first pair. By having a longer channel, this will also cause the threshold voltage of the second pair of NMOS and PMOS transistors to be higher in relation to the threshold voltage of the NMOS and PMOS transistor of the first pair.

DETAILED DESCRIPTION OF THE PRESENT INVENTION

Figure 1:
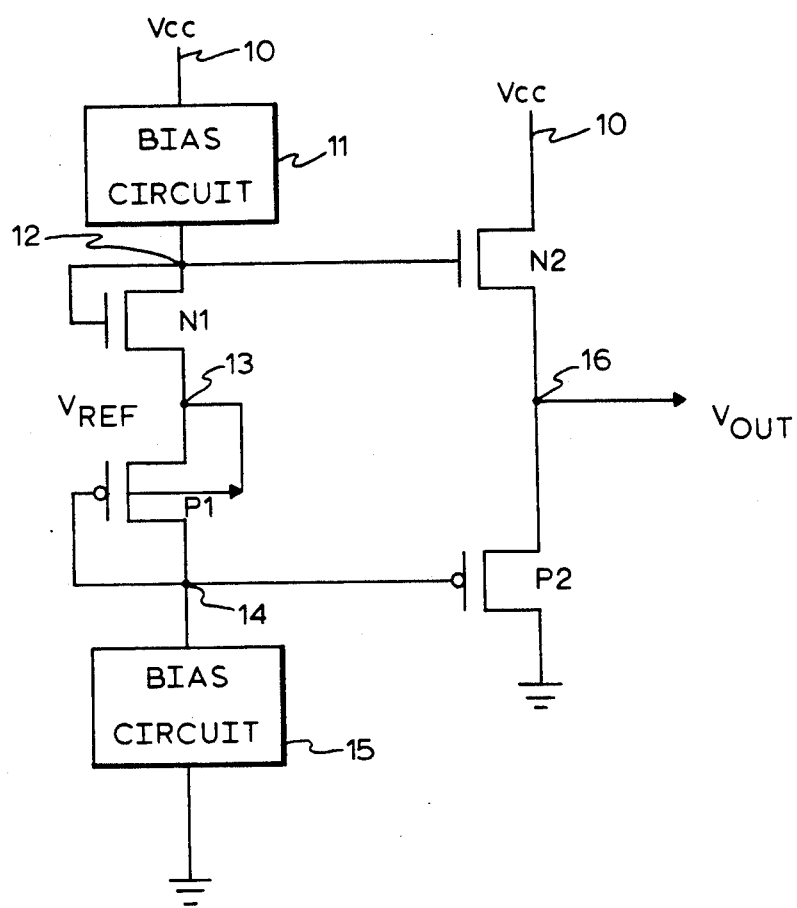
FIG. 1 is a circuit diagram illustrating a prior art DC voltage generator.

A DC voltage generator for generating low standby current and intermediate DC voltage levels for use primarily in integrated circuits is described. In the following description, numerous specific details, such as threshold voltage levels, transistor channel width and length specifications, etc., are described in detail to provide a more thorough description of the present invention. It will be apparent, however, to one skilled in the art, that the present invention may be practiced without these specific details. In other instances, well-known features have not been described in detail so as not to obscure the present invention.

The preferred embodiment of the present invention relies on the novel utilization of inherent MOS transistor properties. In order to maintain low standby current in a DC voltage generator, the short channel length and narrow width effects are used. These properties allow the present invention to reduce the standby current associated with the DRAM DC generators, while still maintaining the merits provided by DC generators. These merits include lower operating current, faster speed, better cell reliability, and better bit line sensing scheme.

The present invention takes advantage of the short channel effect and the transistor width effect to ensure that transistors N2 and P2 have a threshold voltage greater than the threshold voltage of transistors N1 and P1. This prevents transistors N2 and P2 from turning on at the same time during normal operation of the voltage generator. With transistor N2 off, $V_{OUT}$ is approximately equal to $V_{REF}$. In addition, very low standby current levels can be achieved by lowering the operating current of the bias circuit in the range of 5-10 micro-amperes.

The second stage transistors of the present invention have a channel length which is greater than the channel length of the first stage transistors. As a result, as shown in the relationship between threshold voltage and channel length in FIG. 3, the second stage transistors have a threshold voltage higher than the first stage transistors. In addition, the second stage transistors of the present invention have a narrower channel width than the first stage transistors. As shown by the graph of threshold voltage vs. transistor width in FIG. 4, this also leads to a higher threshold voltage than the first stage transistors.

The preferred embodiment of the present invention replaces the NMOS transistor of the second stage CMOS pair of transistors of the prior art with a multiple set of NMOS transistors coupled together in parallel whose sum of W/L is the equivalent of the transistor W/L of the original NMOS transistor. Also, the PMOS transistor of the second stage of CMOS pair of transistors of the prior art is replaced with a multiple set of PMOS transistors coupled in parallel and whose sum of W/L is the equivalent of the transistors W/L of the prior art PMOS transistor. This design is implemented in order to ensure that the threshold voltages of the second stage are higher than the threshold voltages of the first CMOS stage and still maintains equivalent current drive capability of the prior art DC voltage generator. This, in turn, will ensure optimal operation of the DC voltage generator.

Figure 2:
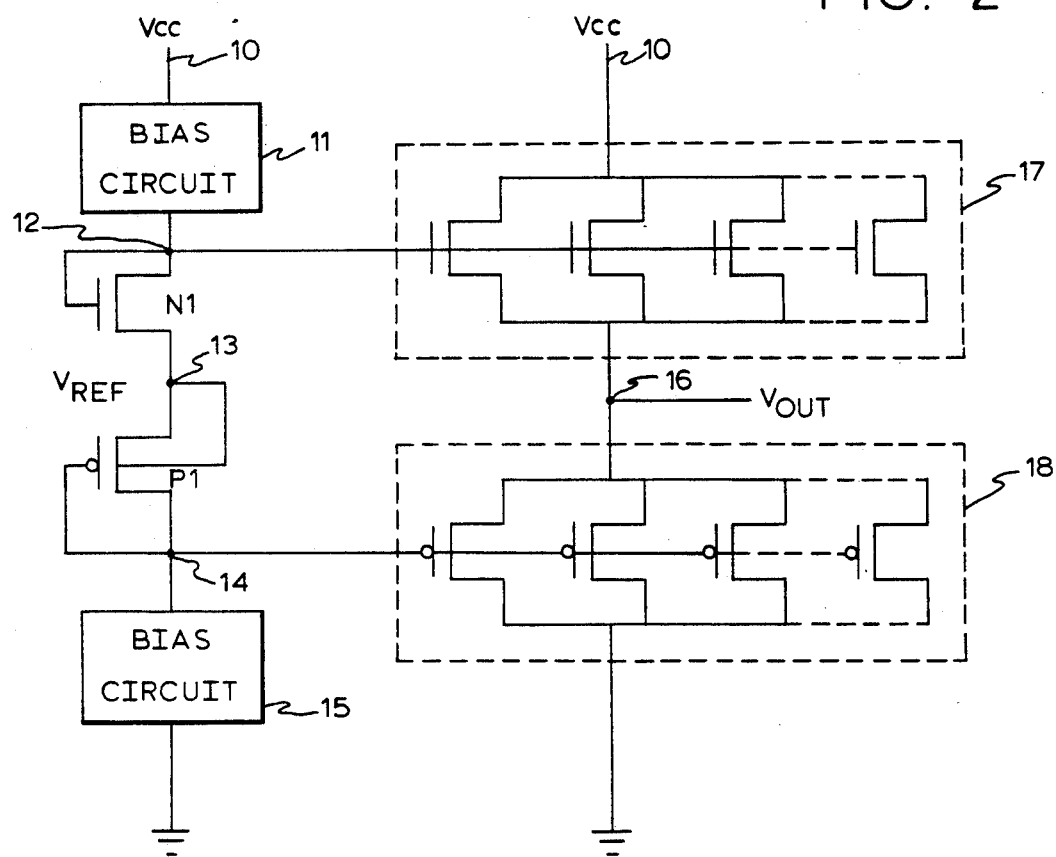
FIG. 2 is a circuit diagram of the preferred embodiment of the present invention.

The preferred embodiment of the present invention is illustrated in FIG. 2. The DC generator of the present invention consists of a first complementary pair of transistors N1 and P1, a second stage of complementary transistors block 17 and block 18 where block 17 is a multiple of NMOS transistors in parallel source coupled to a block 18 which is a multiple of PMOS transistors in parallel. The drain of NMOS transistor N1 is coupled to its own gate terminal as well as coupled to bias circuit 11 at node 12. Node 12 is also coupled to the gate terminals of the NMOS transistors coupled in parallel in block 17. Bias circuit 11 is coupled to voltage supply 10. The source of NMOS transistor N1 is coupled to the source of PMOS transistor P1 at node 13 where the reference voltage $V_{REF}$ is taken from. The body terminal of transistor P1 is also coupled to node 13 to minimize the body-effect to reduce the threshold voltage of P1. At node 14, the gate and drain of transistor P1 and bias circuit 15 are coupled together. Node 14 is also coupled to the gates of the PMOS transistors inside block 18. Bias circuit 15 is coupled to ground. The drains of the transistors in block 18 are coupled to ground. The sources of the transistors in block 18 are coupled to the sources of the transistors in block 17 at node 16. Output voltage $V_{OUT}$ is taken from node 16. The drains of the transistors in block 17 are coupled to voltage supply $V_{CC}$ 10.

To reduce standby current in the present invention when $V_{OUT}$ is pulled up by block 17 to $V_{REF}$, blocks 17 and 18 are turned off to minimize the standby current. The present invention achieves this goal by ensuring that the threshold voltage of transistor N1 and P1 are less than the threshold voltages of the transistors in blocks 17 and 18. Thus, the transistors of blocks 17 and 18 are normally off, fully cutting off the switching current and standby current contributed by the second stage driver transistors.

In the first CMOS-based transistor stage of FIG. 2, the voltage level at node 13 is biased to $V_{REF}$. Assuming that $V_{CC}$ is high enough and transistor N1 is turned on, the voltage level at the gate of transistor N1 is $V_{REF}+V_{TN1}$, $V_{TN1}$ being the threshold voltage of transistor N1. Coupled to the gate of transistor N1, the drain of transistor N1 as well as the gates of the transistors in block 17 also are biased at $V_{REF}+V_{TN1}$. The present invention biases the second CMOS-based transistor stage so that the output voltage at node 16 $V_{OUT}$ is approximately the same value as $V_{REF}$. Thus, the gate-to-source voltage $V_{GS}$ for the transistors in block 17 is $V_{REF}+V_{TN1}-V_{OUT} \approx V_{REF}+V_{TN1}-V_{REF}=V_{TN1}$. Because the DC voltage generator of the present invention has been specifically designed so that $V_{TN1}$ is less than the $V_T$ of the transistors in block 17, the transistors in block 17 are off and not conducting any current from the driving transistor N1. The threshold voltages in block 17 are made to be greater than $V_{TN1}$ by implementing the MOS transistor short channel effect and narrow width effect.

The channel width divided by channel length ratio W/L, has significant influence over the voltage-current characteristics of MOS transistors. Although transistors on a chip may receive the same doping and experience the same processing variations, their threshold voltages can be distinct by using different W/L ratios.

Threshold voltage reduction resulting from the short channel effect becomes significant when the channel length is on the order of a micron. At this point, the space charge regions from the source and drain appreciably affect the geometry of the channel such that the depletion region charge in the channel is less than the charge calculated using standard threshold voltage equations. When this effect is taken into account, it can be seen that there is short-channel reduction in $V_T$.

The narrow width effect causes the threshold voltage to increase in magnitude because some of the gate-induced space charge is lost in fringing electric fields which increases the depletion charge, which in turn increases the threshold voltage. The present invention divides the transistors N2 and P2 into a plurality of narrow width transistors whose sum of W/L is the same as the W/L of the prior art transistors N2 and P2. Having this multiple set of much more narrow transistors coupled in parallel effectively raises the threshold voltage as described earlier.

Furthermore, the length of the channels in the transistors of blocks 17 and 18 are processed to be longer than the channel length of transistors N1 and P1. A typical layout might have the channel length of transistor N1 and P1 be minimum design rule plus 0.2 μm and the length of channels in blocks 17 and 18 be greater than or equal to 3 or 4 μm, dependent on the level-off point of technology used. This alone can force the threshold voltages of blocks 17 and 18 to be greater by a couple tenths of voltage to ensure that N2 and P2 have no chance to turn on at the same time, to fully shut off the switching current and to reduce the standby current contributed by blocks 17 and 18.

Figure 3:
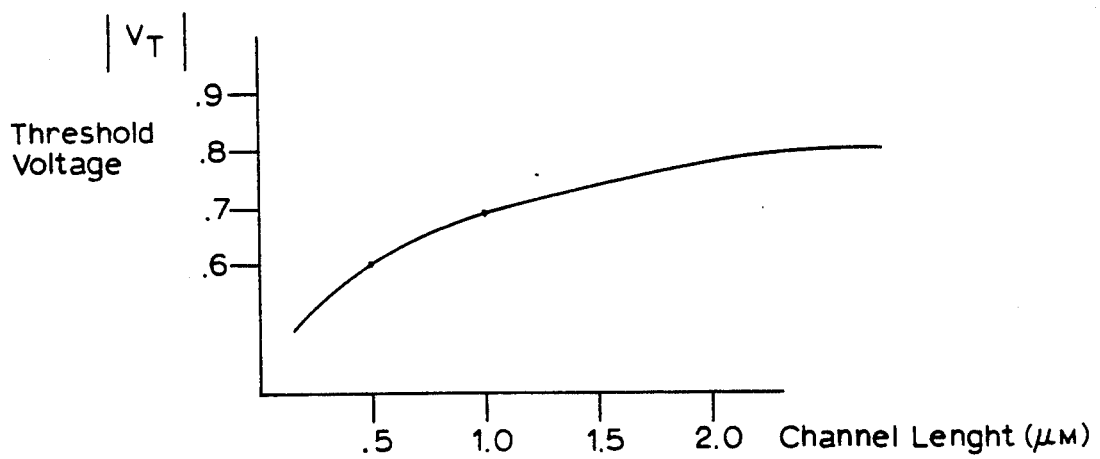
FIG. 3 illustrates the relationship between the threshold voltage of a MOS transistor and its channel length.
Figure 4:
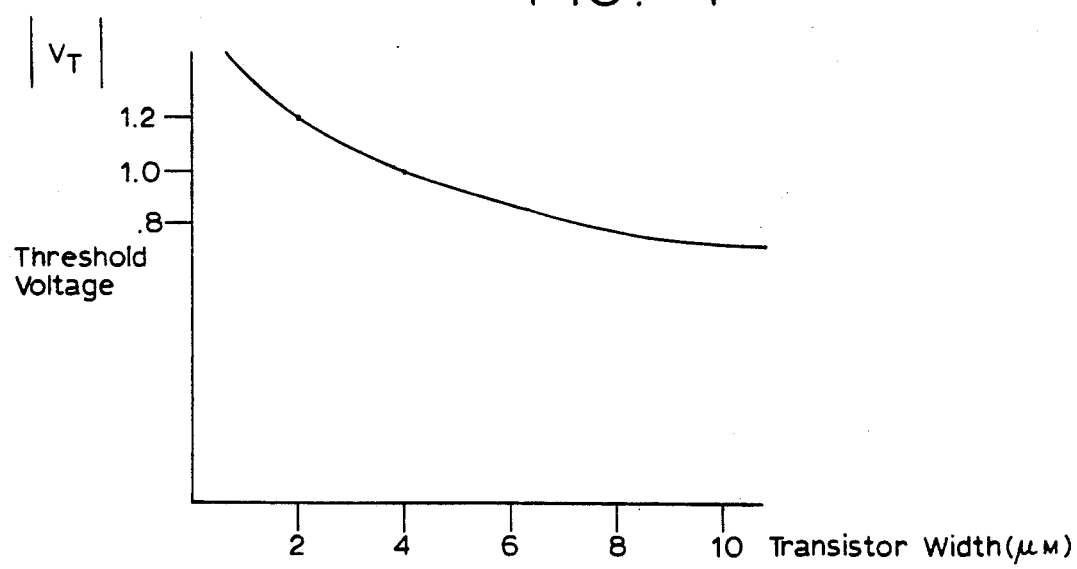
FIG. 4 illustrates the relationship between the threshold voltage of a MOS transistor and the width of the transistor.
Figure 5:
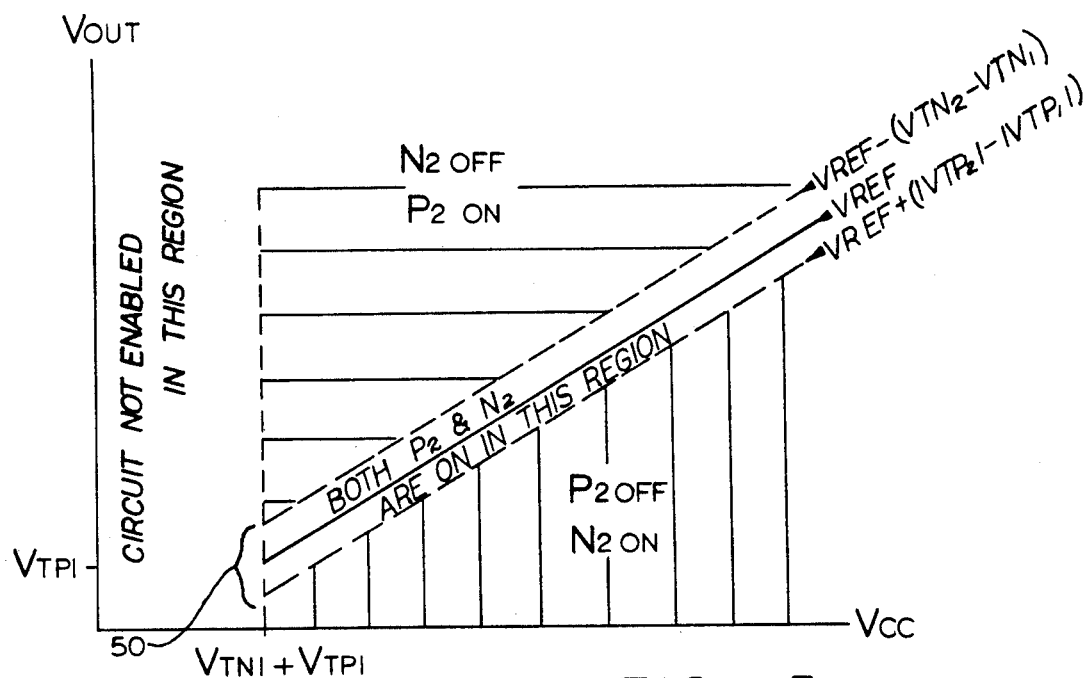
FIG. 5 illustrates the turn-on conditions of N2 and P2 for a prior art DC voltage generator.
Figure 6:
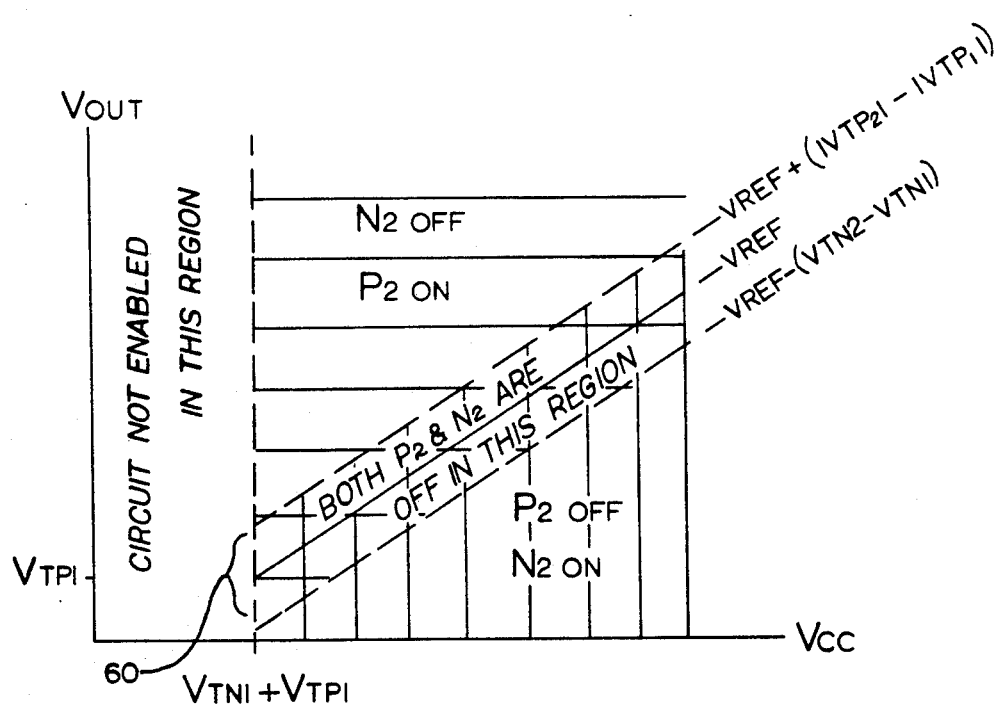
FIG. 6 illustrates the turn-on conditions of second pair of NMOS and PMOS transistors of the present invention.

FIGS. 3 and 4 illustrate the dependence of the absolute value of the threshold voltage to the channel length and width when at the micron level. A typical design might have the channel widths of transistor N1 and P1 be greater than 8 or 10 microns, and the width of transistors in blocks 17 and 18 be 3-5 microns dependent on the transistor characteristics provided by the technology used. It can be seen at smaller geometries the dependence is more pronounced. By implementing these two inherent properties, low standby current in a DC voltage generator with wide process margins can be achieved.

Thus, a novel DC voltage generator providing low standby current has been described.

We claim:

1. A DC voltage generator circuit for generating low standby current comprising:
a first CMOS transistor stage comprising a first transistor of a first conductivity type coupled in series with a second transistor of a second conductivity type, said first and second transistors having channel lengths, channel widths and threshold voltages associated therewith;
a first biasing means coupled to said first transistor;

a second biasing means coupled to said second transistor;

a second CMOS transistor stage coupled to said first CMOS transistor stage comprising a first set of transistors of said first conductivity type with transistors of said first set of transistors coupled in parallel, said first set of transistors coupled in series with a second set of transistors of said second conductivity type, with transistors of said second set of transistors coupled in parallel, transistors within said second stage having channel lengths, channel widths and threshold voltages associated therewith;

wherein:

channel lengths of transistors in said second stage are longer than said channel lengths of transistors of corresponding conductivity types in said first stage; and channel widths of transistors in said second stage are narrower than said channel widths of transistors of corresponding conductivity types in said first stage.

2. The circuit of claim 1 wherein said first conductivity type is N type.

3. The circuit of claim 1 wherein the threshold voltages of said first set of transistors is higher than the threshold voltage of said first transistor.

4. The circuit of claim 3 wherein normal operation of said circuit requires that the output voltages of said first and second CMOS transistor stages be substantially the same, and that said first and second set of transistors be turned off.

5. A circuit for generating an output voltage comprising:

first biasing means coupled to a supply voltage;

first transistor means of a first conductivity type coupled to said first biasing means at a first node, said first transistor means having a channel length L1 and a channel width W1;

second transistor means of a second conductivity type coupled to said first transistor means, said second transistor means having a channel length L2 and channel width W2;

second biasing means coupled to said second transistor means at a second node;

third transistor means of said first conductivity type coupled to said first node and to said supply voltage, said third transistor means having a channel length L3 and a channel width W3;

fourth transistor means of said second conductivity type coupled to said second node and to said third transistor means at a third node, said fourth transistor means having a channel length L4 and a channel width W4;

said circuit providing an output voltage at said third node;

said third and fourth transistor means having a threshold voltage less than a threshold voltage of said first and second transistors;

and wherein L3 is greater than L1; L4 is greater than L2; W3 is less than W1; and W4 is less than W2.

6. The circuit of claim 5 wherein said first conductivity type is N type.

7. The circuit of claim 5 wherein said third transistor means comprises a plurality of N type transistors coupled in parallel.

8. The circuit of claim 5 wherein said fourth transistor means comprises a plurality of P type transistors coupled in parallel.

9. The circuit of claim 5 wherein said first transistor means comprises an N type transistor having a drain and gate coupled to said first node.

10. The circuit of claim 9 wherein said second transistor means comprises a P type transistor having a drain and gate coupled to said second node and source coupled to a source of said first transistor means.

11. A circuit for generating an output voltage comprising:

first biasing means coupled to a supply voltage;

first transistor means of a first conductivity type coupled to said first biasing means at a first node, said first transistor means having a channel length L1 and a channel width W1;

second transistor means of a second conductivity type coupled to said first transistor means, said second transistor means having a channel length L2 and channel width W2;

second biasing means coupled to said second transistor means at a second node;

third transistor means of said first conductivity type coupled to said first node and to said supply voltage, said third transistor means having a channel length L3 and a channel width W3 where L3 is greater than L1 and W3 is less than W1;

fourth transistor means of said second conductivity type coupled to said second node and to said third transistor means at a third node, said fourth transistor means having a channel length L4 and a channel width W4 where L4 is greater than L2 and W4 is less than W2;

said circuit providing an output voltage at said third node;

said third and fourth transistor means having a threshold voltage less than a threshold voltage of said first and second transistors.

12. The circuit of claim 11 wherein said first conductivity type is N type.

13. The circuit of claim 11 wherein said third transistor means comprises a plurality of N type transistors coupled in parallel.

14. The circuit of claim 11 wherein said fourth transistor means comprises a plurality of P type transistors coupled in parallel.

15. The circuit of claim 11 wherein said first transistor means comprises an N type transistor having a drain and gate coupled to said first node.

16. The circuit of claim 15 wherein said second transistor means comprises a P type transistor having a drain and gate coupled to said second node and a source coupled to a source of said first transistor means.

* * * * *